(12) United States Patent
Oda et al.

(10) Patent No.: US 10,403,709 B2
(45) Date of Patent: Sep. 3, 2019

(54) METHOD FOR MANUFACTURING SEMICONDUCTOR DEVICE

(71) Applicant: DENSO CORPORATION, Kariya, Aichi-pref. (JP)

(72) Inventors: Youhei Oda, Kariya (JP); Tsuyoshi Fujiwara, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/777,681

(22) PCT Filed: Nov. 17, 2016

(86) PCT No.: PCT/JP2016/084092
§ 371 (c)(1),
(2) Date: May 21, 2018

(87) PCT Pub. No.: WO2017/126207
PCT Pub. Date: Jul. 27, 2017

(65) Prior Publication Data
US 2018/0350897 A1 Dec. 6, 2018

(30) Foreign Application Priority Data
Jan. 22, 2016 (JP) .................. 2016-010821

(51) Int. Cl.
| H01L 21/20 | (2006.01) |
| H01L 49/02 | (2006.01) |
| C23C 14/06 | (2006.01) |
| C23C 16/06 | (2006.01) |
| H01L 21/822 | (2006.01) |
(Continued)

(52) U.S. Cl.
CPC .............. *H01L 28/75* (2013.01); *C23C 14/06* (2013.01); *C23C 16/06* (2013.01); *C23C 16/34* (2013.01); *C23C 16/40* (2013.01); *H01L 21/28562* (2013.01); *H01L 21/822* (2013.01); *H01L 27/04* (2013.01)

(58) Field of Classification Search
CPC . H01L 28/75; H01L 21/28562; H01L 21/822; H01L 27/04; H01L 29/94; C23C 14/06; C23C 16/06; C23C 16/34; C23C 16/40
USPC ......................................................... 438/399
See application file for complete search history.

(56) References Cited

U.S. PATENT DOCUMENTS

| 2004/0012911 A1 | 1/2004 | Lee et al. |
| 2004/0084709 A1 | 5/2004 | Kim et al. |
(Continued)

FOREIGN PATENT DOCUMENTS

JP H11-274428 A 10/1999

*Primary Examiner* — David S Blum
(74) *Attorney, Agent, or Firm* — Posz Law Group, PLC

(57) ABSTRACT

Roughness is eliminated and planarization is achieved by a metal oxide film on a surface of a lower electrode. Consequently, damage on a capacitive film caused by the roughness of the lower electrode is reduced. Furthermore, physical damage on the capacitive film is reduced by forming a first layer of an upper electrode by, for example, CVD. Consequently, the damage on the capacitive film is suppressed, and the reliability of the capacitive film is improved. Furthermore, not by forming the whole upper electrode by the CVD or the like, but by forming a second layer by PCD or the like on the first layer, an increase in resistance of the upper electrode is suppressed as well.

4 Claims, 10 Drawing Sheets

(51) Int. Cl.
*H01L 27/04* (2006.01)
*C23C 16/34* (2006.01)
*C23C 16/40* (2006.01)
*H01L 21/285* (2006.01)

(56) References Cited

U.S. PATENT DOCUMENTS

| | | |
|---|---|---|
| 2006/0017090 A1 | 1/2006 | Fukumaki et al. |
| 2006/0267098 A1 | 11/2006 | Fujimaki |
| 2007/0004133 A1 | 1/2007 | Kim et al. |
| 2008/0042286 A1 | 2/2008 | Fujimaki |
| 2011/0304017 A1 | 12/2011 | Iwaki et al. |
| 2012/0092807 A1 | 4/2012 | Popovici et al. |
| 2012/0269962 A1 | 10/2012 | Blomberg et al. |
| 2013/0089964 A1 | 4/2013 | Iwaki et al. |
| 2014/0217548 A1 | 8/2014 | Totsuka |
| 2014/0266408 A1* | 9/2014 | Guimaraes ............... H01L 28/40 327/534 |

* cited by examiner

=

+

METHOD FOR MANUFACTURING SEMICONDUCTOR DEVICE

CROSS REFERENCE TO RELATED APPLICATIONS

This application is a U.S. national stage application of International Application No. PCT/JP2016/084092 filed on Nov. 17, 2016 and is based on Japanese Patent Application No. 2016-10821 filed on Jan. 22, 2016, the disclosures of which are incorporated herein by reference.

TECHNICAL FIELD

The present disclosure relates to a method for manufacturing a semiconductor device having a capacitor with a Metal-Insulator-Metal structure (hereinafter referred to as an MIM capacitor.

BACKGROUND

It has been conventionally known that a capacitive film is interposed between a lower electrode and an upper electrode in an MIM capacitor. For example, Patent Literature 1 discloses a method for manufacturing an MIM capacitor by forming a capacitive film on the lower electrode and then forming the upper electrode by chemical vapor deposition (hereinafter referred to as CVD).

PRIOR ART LITERATURES

Patent Literature

Patent Literature 1: JP 2015-61947 A

SUMMARY

However, a higher resistance occurs in an upper electrode if the upper electrode is formed by the CVD.

When the upper electrode is formed by the CVD, an advantageous effect of reducing damage on the capacitive film as a base and improving reliability in the capacitive film can be achieved. This type of effect can be attained by reducing damage on the capacitive film as the base. Accordingly, it is possible to suppress a higher increase in resistance of the upper electrode while improving the reliability of the capacitive film without using the CVD as long as the damage on the capacitive film can be reduced. In addition, even when the damage on the capacitive film is reduced by using the CVD, the reliability of the capacitive film can be improved as long as the high increase in resistance can be suppressed and further the damage on the capacitive film is suppressed.

The present disclosure aims to provide a method for manufacturing a semiconductor device in which the reliability of a capacitive film is improved by suppressing damage on the capacitive film as a first object. Moreover, the present disclosure aims to provide a method for manufacturing a semiconductor device to suppress a higher increase in resistance occurred in an electrode.

A method for manufacturing a semiconductor device according to one aspect of the present disclosure includes: forming a first electrode; forming a capacitive film on the first electrode, the capacitive film in contact with the first electrode; and forming a second electrode on the capacitive film, the second electrode in contact with the capacitive film. In the forming of the second electrode, a first layer is formed on a surface of the capacitive film through chemical vapor deposition, atomic layer deposition, or metal organic chemical vapor deposition, and a second layer is formed on the first layer through physical vapor deposition.

Accordingly, the first layer is formed on a surface of the capacitive film through chemical vapor deposition, atomic layer deposition, or metal organic chemical vapor deposition, and a second layer is formed on the first layer through physical vapor deposition; therefore, the damage on the capacitive film is suppressed. In addition, the whole second electrode is not formed through chemical vapor deposition, atomic layer deposition, or metal organic chemical vapor deposition, but is formed on the first layer through physical vapor deposition. Therefore, the method for manufacturing the semiconductor device is possible to suppress the damage on the capacitive film while improving the reliability of the capacitive film.

A method for manufacturing a semiconductor device according to another aspect of the present disclosure includes: forming a first electrode; forming a capacitive film on the first electrode, the capacitive film in contact with the first electrode; and forming a second electrode on the capacitive film, the second electrode in contact with the capacitive film. Additionally, in the forming of the first electrode, Accordingly, in the forming of the metal oxide film on one surface of the first electrode facing the capacitive film, the roughness of the first electrode is eliminated and hence the first electrode is made to be flat. The damage on the capacitive film caused by the roughness of the first electrode is reduced. Thus, the method for manufacturing the semiconductor device is possible to suppress the damage on the capacitive film while improving the reliability of the capacitive film.

EMBODIMENTS

The following describes several embodiments according to the present disclosure with reference to drawings. In the following alternative embodiments, the same or similar components are indicated with the same reference numbers.

(First Embodiment)

The following describes a first embodiment. The present embodiment describes with an example of a plate supporting structure as an MIM capacitor. A semiconductor having the MIM capacitor described herein may be used for, for example, an analog-to-digital converter (hereinafter referred to as an A/D converter).

Figure 1:
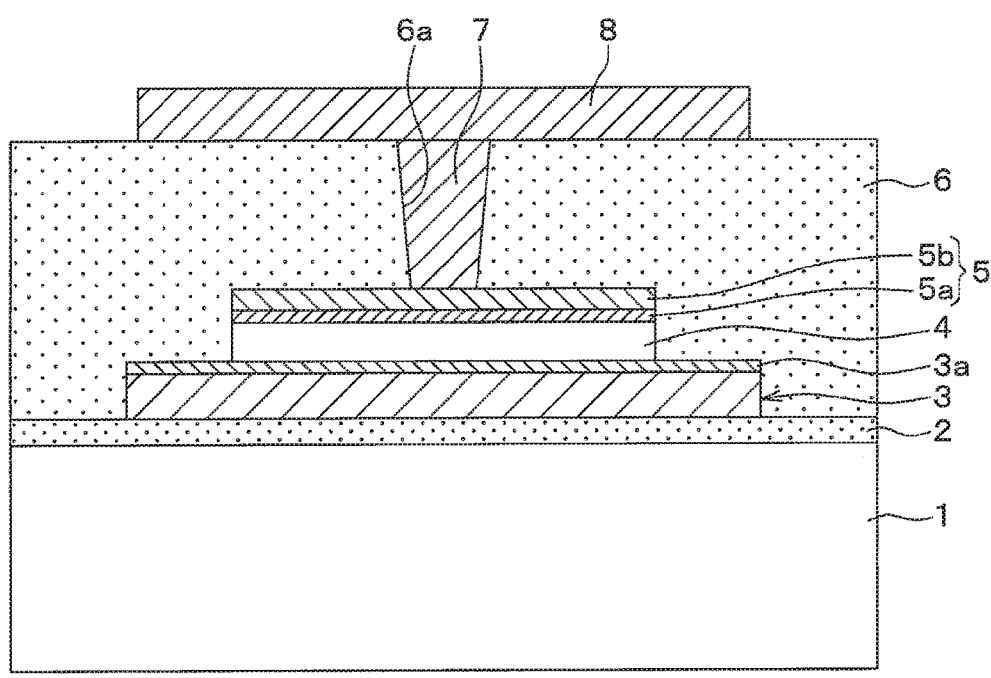
FIG. 1 is a cross sectional view of a semiconductor device according to a first embodiment.

As illustrated in FIG. 1, the MIM capacitor is formed on a semiconductor substrate 1 such as a silicon substrate through an insulation film 2. In particular, the MIM capacitor is configured such that a lower electrode 3, a capacitive film 4 and an upper electrode 5 are stacked in order on an insulation film 2.

The lower electrode 3 corresponds to a first electrode, and is configured by using an ordinary electrode material. Additionally, the lower electrode 3 is configured by forming a metal oxide film 3a on one surface of the lower electrode 3, which is connected to the capacitive film 4. For example, the lower electrode 3 is formed by a laminated film having a single layer film such as aluminum (Al), titanium nitride (TiN), titanium (Ti), copper (Cu), polysilicon doped with impurities, metallic silicide, or a layer film having a plurality of electrode materials such as aluminum and copper. The metal oxide film 3a is configured by oxidizing the surface of the lower electrode 3.

The capacitive film 4 is configured by an insulation film, and is formed in a planar shape on the lower electrode 3 in the present embodiment. For example, the capacitive film 4 is configured by an insulation film such as silicon oxidation film (SiO) and silicon nitride film (SiN), and its film thickness is configured according to a required capacitance.

The upper electrode 5 corresponds to a second electrode, and is configured by an ordinary electrode material. Similar to the lower electrode 3, the upper electrode 5 is formed by a laminated film having a single layer film such as aluminum (Al), titanium nitride (TiN), titanium (Ti), copper (Cu), polysilicon doped with impurities, metallic silicide, or a layer film having a plurality of electrode materials such as aluminum and copper. The upper electrode 5 may be configured by the same material, which is used for configuring the lower electrode 6, or may also be configured by different material. One surface of the upper electrode which connects to the capacitive film 4 is configured by a first layer 5a, which is formed by the CVD or Atomic Layer Deposition (hereinafter referred to as ALD). Additionally, the side of the upper electrode 5, which is opposite to the first layer with respect to the capacitive film 4, is configured by a second layer 5b formed by Physical Vapor Deposition (hereinafter referred to as PVD) such as sputtering. The second layer 5b may be formed by, for example, tungsten (W), metal material with lower stress, or polysilicon.

For covering the MIM capacitor, in other words, for covering the interlayer structure having the lower electrode 3, the capacitive film 4 and the upper electrode 5, an interlayer insulation film 6, which is configured by Tetraethyl Orthosilicate film (hereinafter referred to as TEOS film), is formed. A via hole 7, which is filled by bonding metal material such as tungsten plug inside a contact hole 6a of the interlayer insulation film 6, is formed, and a wiring 8 configured by, for example, aluminum formed on the interlayer insulation film 6, is electrically connected to the upper electrode 5.

The semiconductor device with the MIM capacitor according to the present embodiment is configured with the above-mentioned structure. The MIM capacitor included in the semiconductor device configured as mentioned above is connected to a desirable location of an integrated circuit on which wiring (not shown) connected to the lower electrode 3 or wiring 8 connected to the upper electrode 5 is formed on the semiconductor substrate 1, and is used by making connection to an external part through a pad portion.

The following describes a method for manufacturing a semiconductor device with an MIM capacitor illustrated in FIG. 1 with reference to FIG. 2.

Figure 2A:
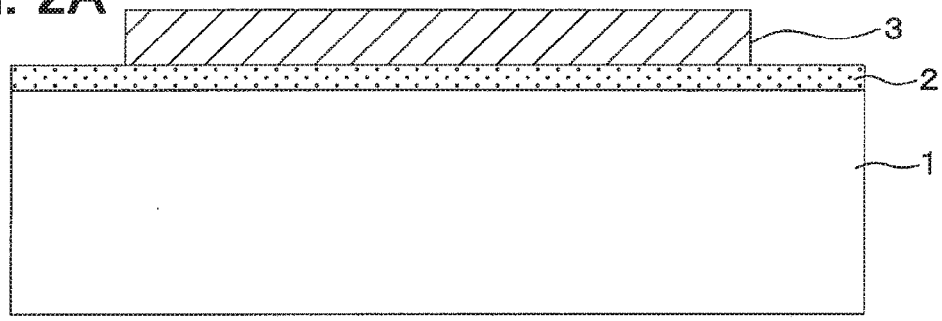
FIGS. 2A to 2D are cross sectional view that illustrates a process for manufacturing the semiconductor device illustrated in FIG. 1.

(Step in FIG. 2A)

First, the semiconductor substrate 1 is prepared. A component, which is formed by, for example, a semiconductor for configuring an integrated circuit or the like if needed, may also be used as the semiconductor substrate 1. The insulation film 2 is formed on the semiconductor substrate 1, and then the lower electrode 3 is formed on the surface of the insulation film 2. For example, the lower electrode 3 is formed by the PVD such as sputtering. Although this disclosure mentions, for example, the matter of using the semiconductor substrate 1 as the substrate, a substrate other than the semiconductor substrate may also be used. If an insulation substrate is used, the insulation film 2 may not be formed.

Figure 2B:
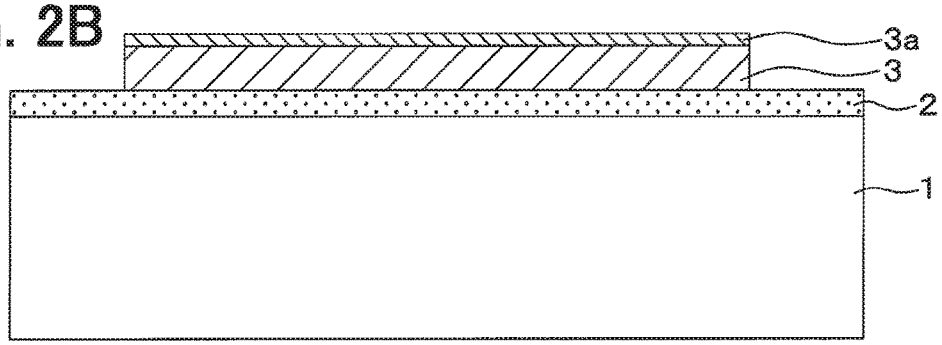

(Step in FIG. 2B)

The metal oxide film 3a is formed by oxidizing the surface layer part of the lower electrode 3. For example, the metal oxide film 3a can be formed by performing, for example, $O_2$ plasma oxidation, which is CVD mainly based on oxygen radical, or thermal oxidation. Oxygen plasma oxidation also includes oxygen gas atmosphere to be included in the process. For example, when dry-etching is included in the process, the metal oxide film 3a may also be formed by oxygen plasma oxidation through oxygen gas atmosphere included in dry-etching gas. For example, the dry-etching is performed in forming the semiconductor, or the dry-etching is formed in forming a contact hole (not shown) on the insulation film 2 or formed in patterning the lower electrode 3.

The lower electrode 3 may be formed by using the above-mentioned material. However, when the lower electrode 3 is configured by titanium nitride, titanium oxidation (TiO) film is formed as the metal oxide film 3a.

Figure 2C:
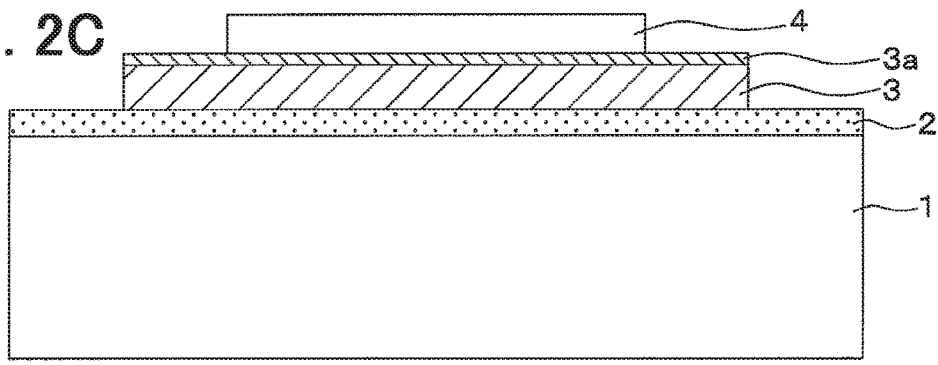

(Step in FIG. 2C)

The capacitive film 4 is formed on the lower electrode 3. The capacitive film 4 is formed by forming silicon oxidation film through, for example, the CVD. In the step of FIG. 2B, since the metal oxide film 3a is formed and the metal oxide film 3a is formed by oxidation of the lower electrode 3 itself, it is possible to suppress damage on the capacitive film 4 formed on the metal oxide film 3. In other words, when the lower electrode 3 is merely formed with a film, the capacitive film 4 where the lower electrode 3 is formed as a base has rough film thickness caused by the roughness on the surface of the lower electrode 3, in other words, the roughness. Accordingly, the quality of film is lowered caused by damage on the capacitive film 4. In addition, even when the metal oxide film formed by another metal different from the lower electrode 3, roughness cannot be improved on the lower electrode 3. In contrast, the roughness of film thickness or degrade in film quality of the capacitive film 4 can be suppressed by configuring the metal oxide film 3a to oxidize one surface side of the lower electrode 3 caused by self-oxidation of the lower electrode 3. In addition, it is also possible to suppress the formation of a pinhole as a ring hole on the capacitive film 4 for suppressing, for example, an initial fault. Moreover, it is possible to reduce the roughness of the surface for eliminating a portion having electrical field concentration by aggressively forming the metal oxide film 3a at one surface side of the lower electrode 3.

Figure 2D:
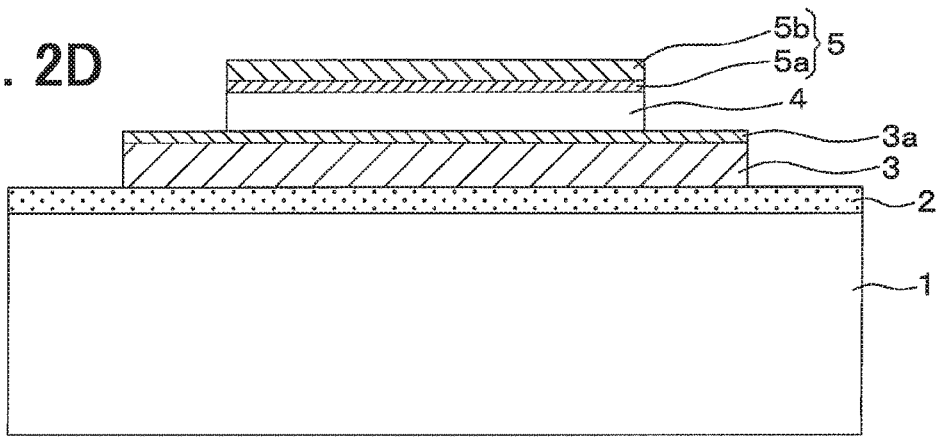

(Step in FIG. 2D)

The upper electrode 5 is formed on the capacitive film 4. At this moment, a first layer 5a is initially formed by the CVD or ALD, and then the upper electrode 5 is formed by forming a second layer 5b through the PVD.

When the upper electrode 5 is formed, performed by the PVD, directly on the capacitive film 4, damage occurs on the capacitive film 4. Accordingly, firstly, the first layer 5a is formed by the CVD or ALD so that the damage hardly occurs on the capacitive film 4. Since an impurity is easy to get into the first layer 5a, which is formed by the CVD or ALD, it is difficult to achieve low-resistance. Accordingly, the second layer 5b is formed by the PVD on the first layer 5a without forming all of the upper electrodes 5 through the CVD or ALD. It is relatively hard for an impurity to get into the second layer 5b formed by the PVD as compared with the first layer 5a formed by the CVD or ALD, therefore, the resistance value of the second layer 5b is lower. Therefore, by forming a laminated film having the first layer 5a and the second layer 5b, it is possible to suppress damage on the capacitive film 4 while achieving lower resistance of the upper electrode 5.

Subsequently, the upper electrode 5 and the capacitive film 4 are patterned by using, for example, a predetermined mask. In the subsequent step (not shown), the interlayer insulation film 6 is formed on, for example, the upper electrode 5. Subsequently, after forming the contact hole 6a on the interlayer insulation film 6 by using the predetermined mask, the via hole 7 is formed by filling the bonding metal material such as tungsten plug into the contact hole 6a. Moreover, after a metal layer such as aluminum is formed on the interlayer insulation film 6, the wiring 8 is formed by patterning through the predetermined mask. Therefore, the semiconductor device having the MIM capacitor illustrated in FIG. 1 can be manufactured.

The following describes a mechanism for changing the capacitance-to-voltage properties (hereinafter referred to as electrical properties) at the MIM capacitor.

Figure 3:
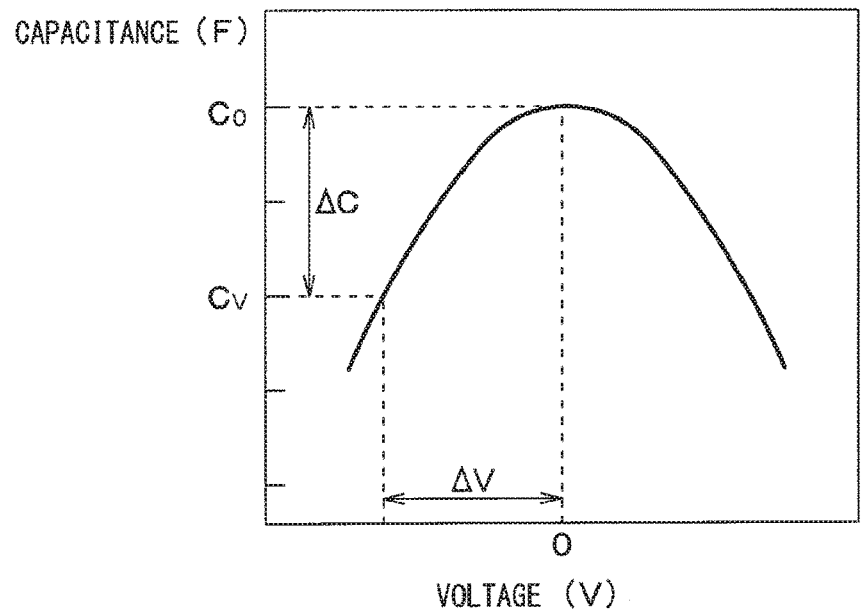
FIG. 3 is a drawing that illustrates electrical properties of the MIM capacitor.

When the MIM capacitor is applied to the A/D converter, when it is configured to output digital result based on an analog input, the influence caused by the electrical properties of the MIM capacitor is represented by a margin of error in A/D conversion. For example, the electrical properties of the MIM capacitor are illustrated as a parabolic relation in FIG. 3. However, the electrical property is better as a change in capacitance is smaller against a change in voltage applied to the MIM capacitor. Thus, the margin of error in A/D conversion can be made smaller. Accordingly, when the MIM capacitor is applied to the A/D converter, it is important to improve the electrical property of the MIM capacitor. Hence, the precision in conversion performed in the A/D converter can be made in higher accuracy.

It is confirmed that the electrical property of the MIM capacitor affects the film quality of the capacitive film 4. In other words, it is confirmed that the electrical property of the MIM capacitor is worsen due to damage on the capacitive film 4 if the film quality of the capacitive film 4 is not good. One reason is that the upper electrode 5 formed on the capacitive film 4 is formed by the PVD, and another reason is that roughness occurs on the surface of the lower electrode 3 as a base at a time of forming the capacitive film 4.

With regard to the roughness on the surface of the lower electrode 3, the roughness definitely is generated when forming the lower electrode 3. In a case where the lower electrode 3 is formed by only, for example, the PVD, the flatness of the surface of the lower electrode 3 cannot be ensured. Accordingly, the damage such as flaw on the capacitive film 4 occurs.

Figure 4:
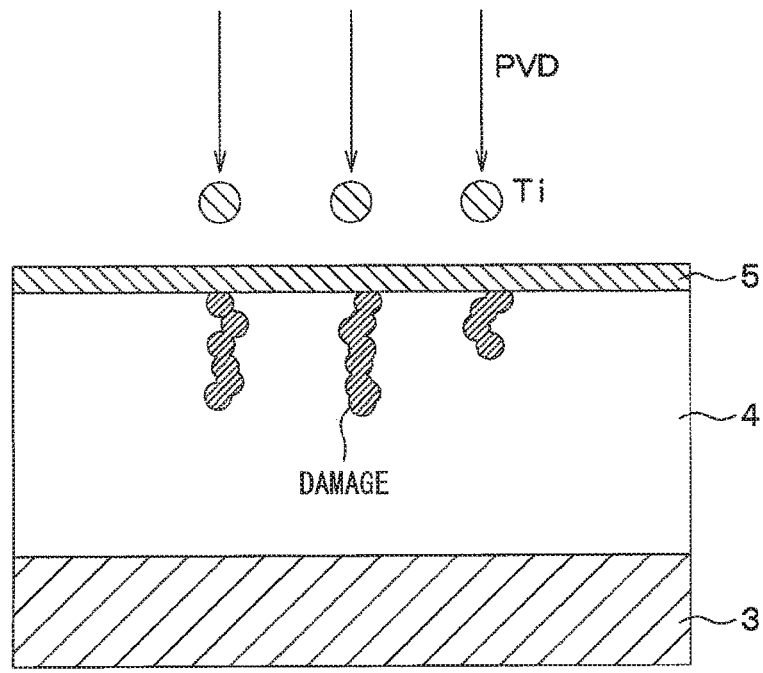
FIG. 4 is a cross sectional view that illustrates damage formed on the capacitive film when an upper electrode is formed by PVD.

In a case where the upper electrode 5 is formed on the capacitive film 4 by the PVD such as sputtering, physical damage caused by sputtering is generated as illustrated in FIG. 4. In particular, when a low strength portion caused by, for example, flaw inside the capacitive film 4 is present, it promotes the progression towards physical damage caused by sputtering. With regard to the MIM capacitor sample after sputtering, the breakdown voltage and Weibull distribution are confirmed, and the result is illustrated in a broken line in FIG. 5. As shown in the figure, a plurality of samples as good products achieves in attaining a breakdown voltage equal to or more than 30 [V]; however, a plurality of samples does not achieve in attaining a breakdown voltage more than or equal to 30 [V]. Based on these results, it is understood that the reliability of the capacitive film 4 decreases due to damage by sputtering so that a desirable breakdown voltage cannot be attained.

Figure 6:
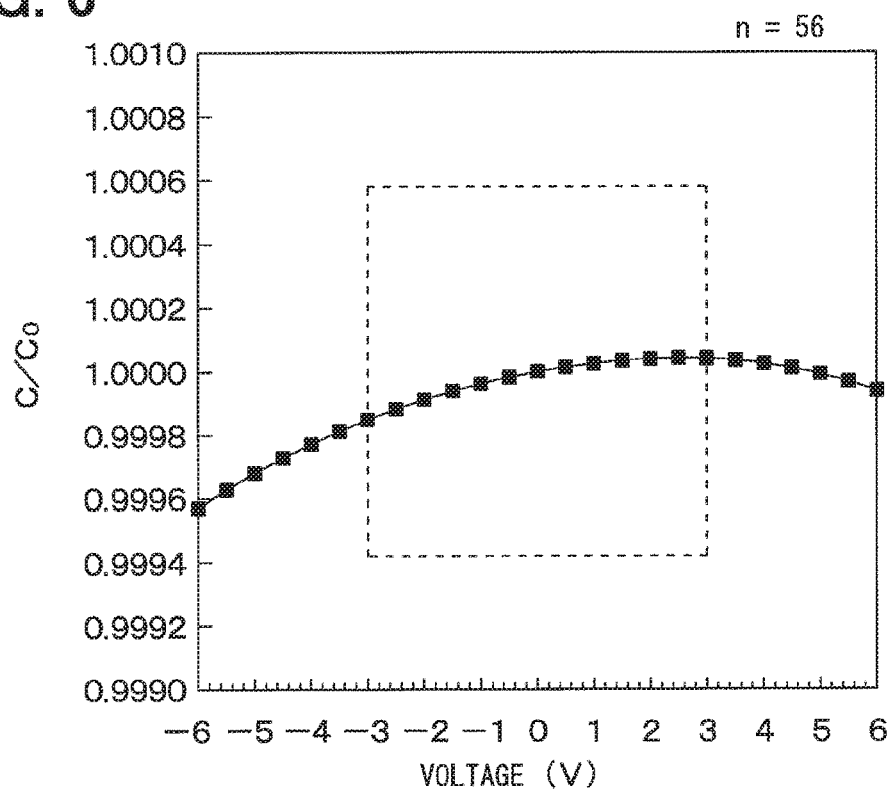
FIG. 6 is a drawing that illustrates the electrical properties of the MIM capacitor when the upper electrode is formed by sputter deposition.

In a case where the upper electrode 5 is formed on the capacitive film 4 by, for example, the PVD such as sputtering, the electrical property of the MIM capacitor is examined and the result is illustrated in FIG. 6. As illustrated in the figure, the electrical property is illustrated as a change in capacitance (C/Co) of the MIM capacitor against a voltage (V) applied to the MIM capacitor in a parabolic relation. When the portion, which is surrounded by a broken line at this electrical property, is illustrated by quadratic approximation, the first coefficient in the quadratic approximation corresponds to the slope of tangent line relative through the vertex of a parabolic line, and the second coefficient corresponds to the degree of opening of the parabolic line. With regard to the electrical property illustrated in FIG. 6, the first coefficient is 38.5 ppm/V; and the second coefficient is −6.9 ppm/V$^2$.

Figure 7A:
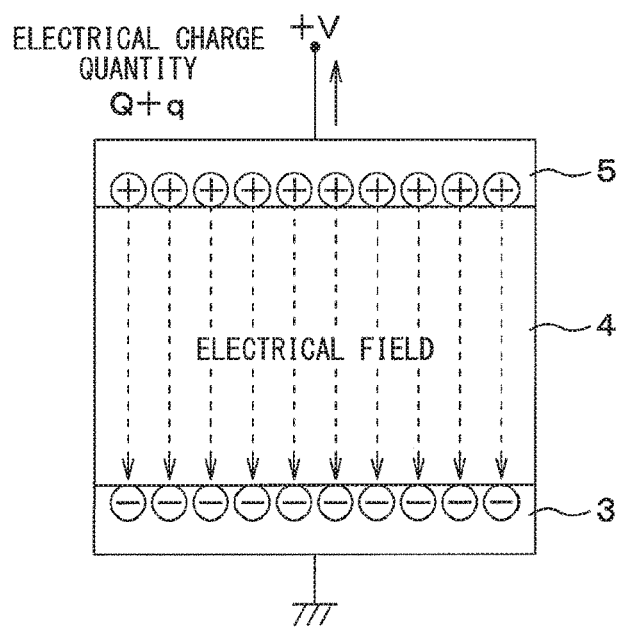
FIG. 7A is a drawing that illustrates an electrical charge inside the MIM capacitor in an ideal state.
Figure 7B:
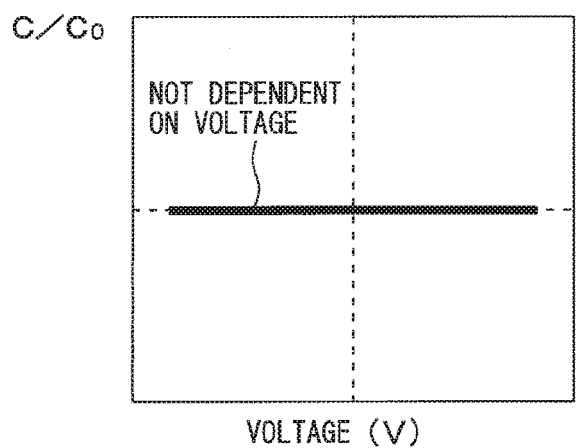
FIG. 7B is a drawing that illustrates the electrical properties of the MIM capacitor in the ideal state.
Figure 8:
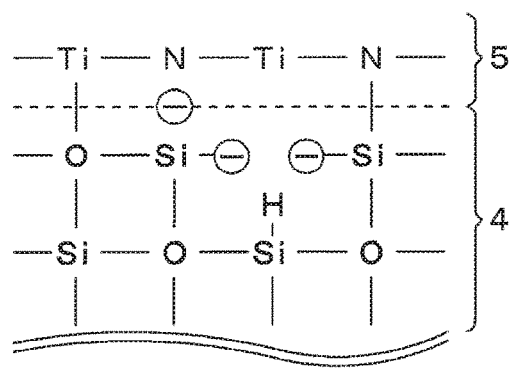
FIG. 8 is a drawing that illustrates an atomic state at the boundary surface between the capacitive film and the upper electrode when damage occurs inside the capacitive film.

If it is in an ideal state in which there is no any flaw in the capacitive film 4 of the MIM capacitor, the electrical charge in the lower electrode 3 and the electrical charge in the upper electrode 5 are in balance as illustrated in FIG. 7A. Thus, the change in capacitance (C/Co) against the voltage (V) applied to the MIM capacitor is constant over any voltage, and the change in capacitance (C/Co) does not depend on voltage (V).

Figure 9A:
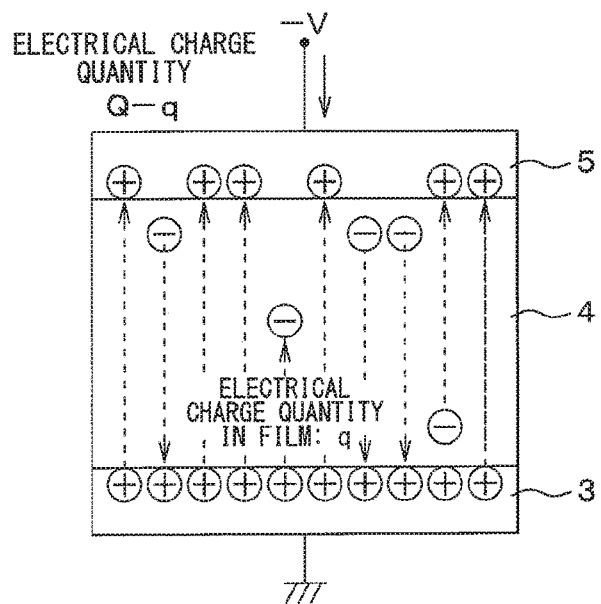
FIG. 9A is a drawing that illustrates the electrical charge inside the MIM capacitor when the damage occurs inside the capacitive film.
Figure 9B:
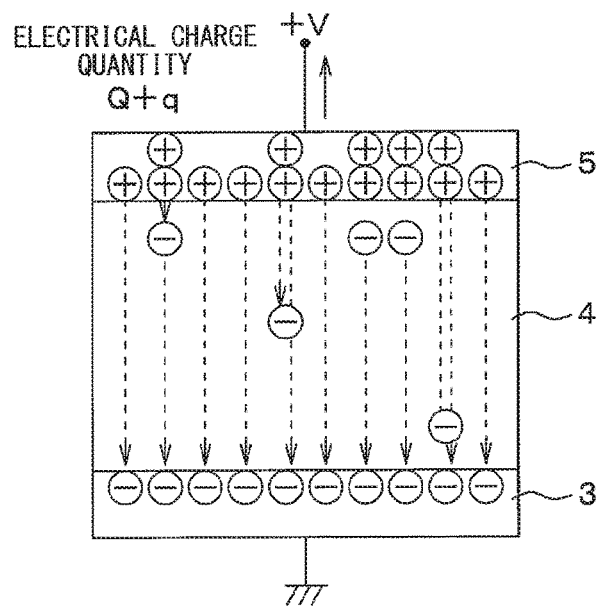
FIG. 9B is a drawing that illustrates the electrical charge inside the MIM capacitor when the damage occurs inside the capacitive film.
Figure 9C:
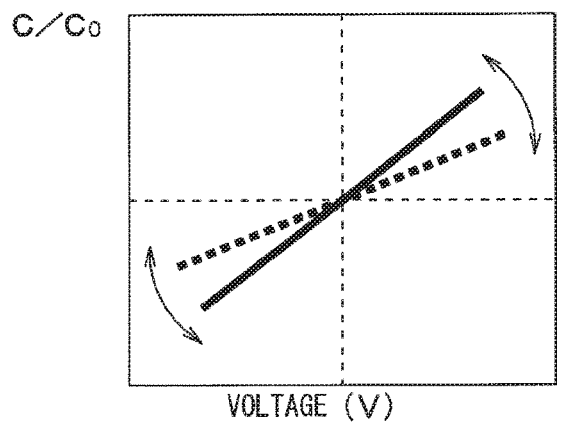
FIG. 9C is a drawing that illustrates the electrical properties of the MIM capacitor when the damage occurs inside the capacitive film.

However, in a case where the capacitive film 4 is formed by the PVD or in a case where damage occurs on the capacitive film 4 due to roughness of the lower electrode 3 as a base, the crystal structure inside the capacitive film 4 is broken so that dangling bonds, in other words, unconnected bonds are generated. The electrical charge is trapped in the dangling bonds, and the change in the electrical property of the MIM capacitor becomes larger. As illustrated in FIGS. 9A and 9B, when a voltage at a negative level as a bias voltage is applied to the upper electrode 5, or when a voltage at a positive level as the bias voltage is applied to the upper electrode 5, the electrical charge increases or decreases depending on the bias voltage at either the positive level or the negative level. Along with this influence, the change in capacitance (C/Co) against the voltage (V) applied to the MIM capacitor, that is, the electrical property is not in constant but is in a slanting condition. The slanting condition in the electrical property shows a linear variation mainly based on the first coefficient, and is varied by the amount of electrical charges being trapped as illustrated as an arrow illustrated in the figure.

Figure 10A:
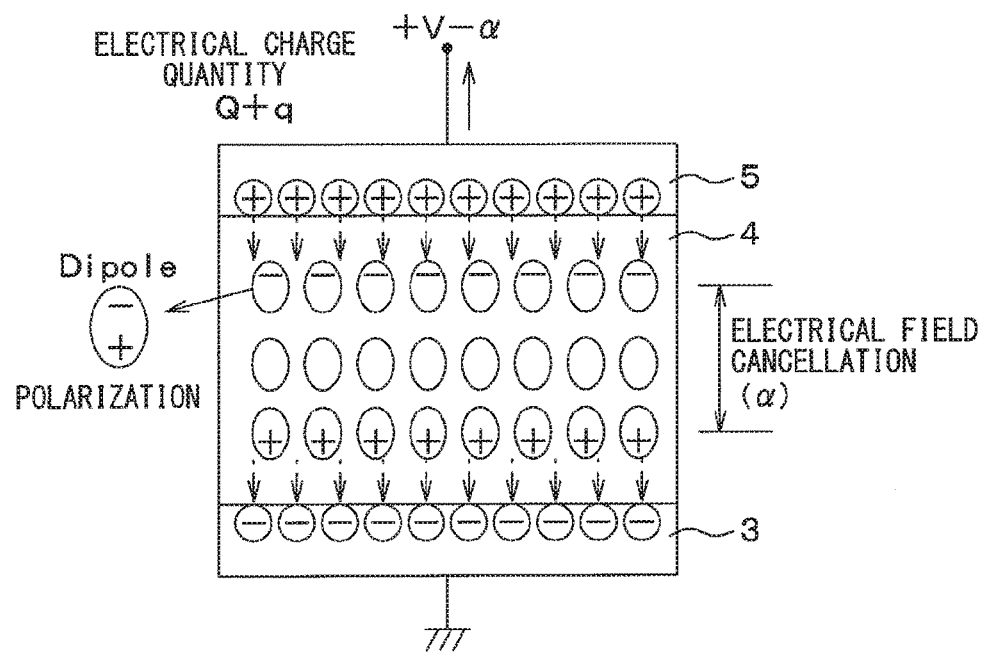
FIG. 10A is a drawing that illustrates the electrical charge inside the MIM capacitor when the damage occurs inside the capacitive film.
Figure 10B:
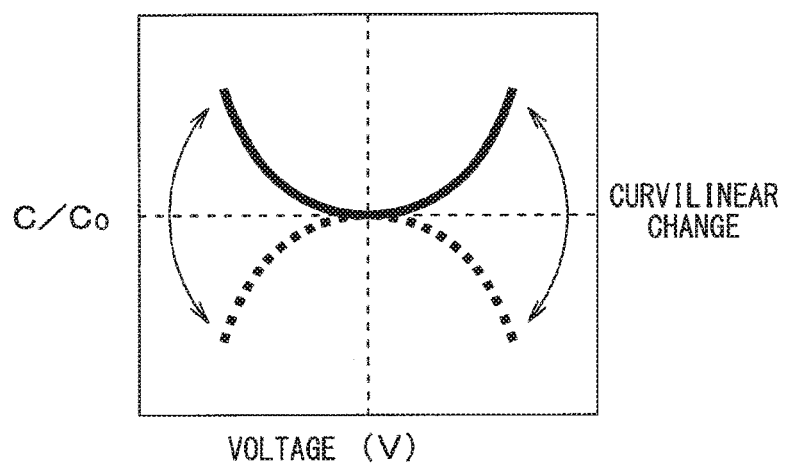
FIG. 10B is a drawing that illustrates the electrical properties of the MIM capacitor when the damage occurs inside the capacitive film.

When flaw is present in the capacitive film 4, the electrical field generated by orientation polarization, which is caused by the flaw, is cancelled as illustrated in FIG. 10A. As illustrated in FIG. 10B, the electrical property mainly based on the second coefficient is changed in a curved line as illustrated in an arrow in the figure.

Accordingly, the flaw is present in the capacitive film 4 so that the first and second coefficients are changing. Therefore, the electrical property of the MIM capacitor is not constant.

Accordingly, as mentioned above, when the metal oxide film 3a if formed at the lower electrode 3; and the first layer 5a is initially formed by the CVD or ALD at a time of forming the upper electrode 5, the damage on the capacitive film 4 can be suppressed and the electrical property of the MIM capacitor can be made to be closely in constant.

Figure 5:
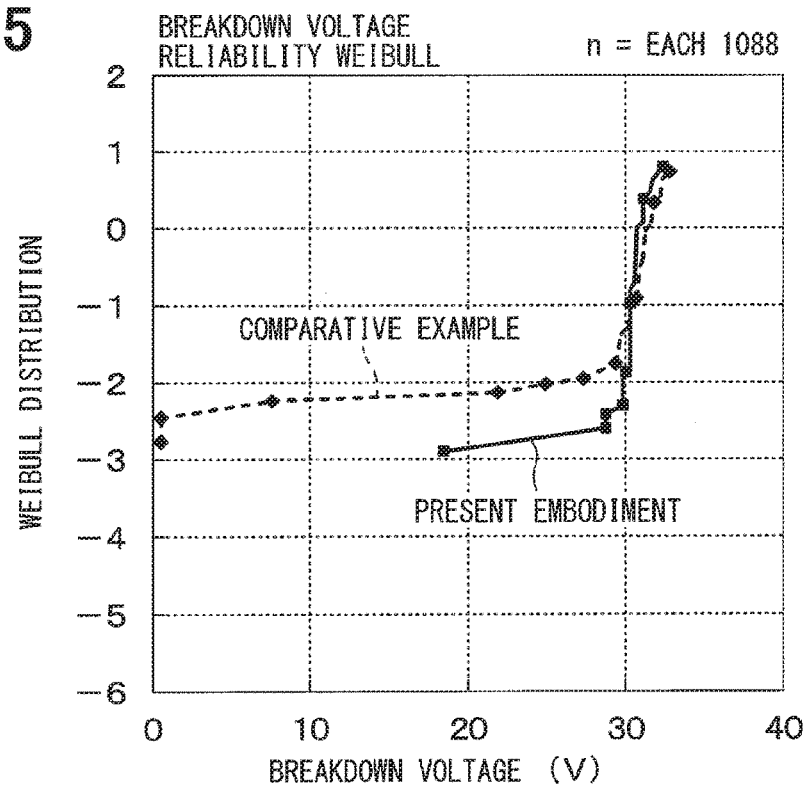
FIG. 5 is a drawing that illustrates a relationship between a breakdown voltage of the MIM capacitor and Weibull distribution.
Figure 11:
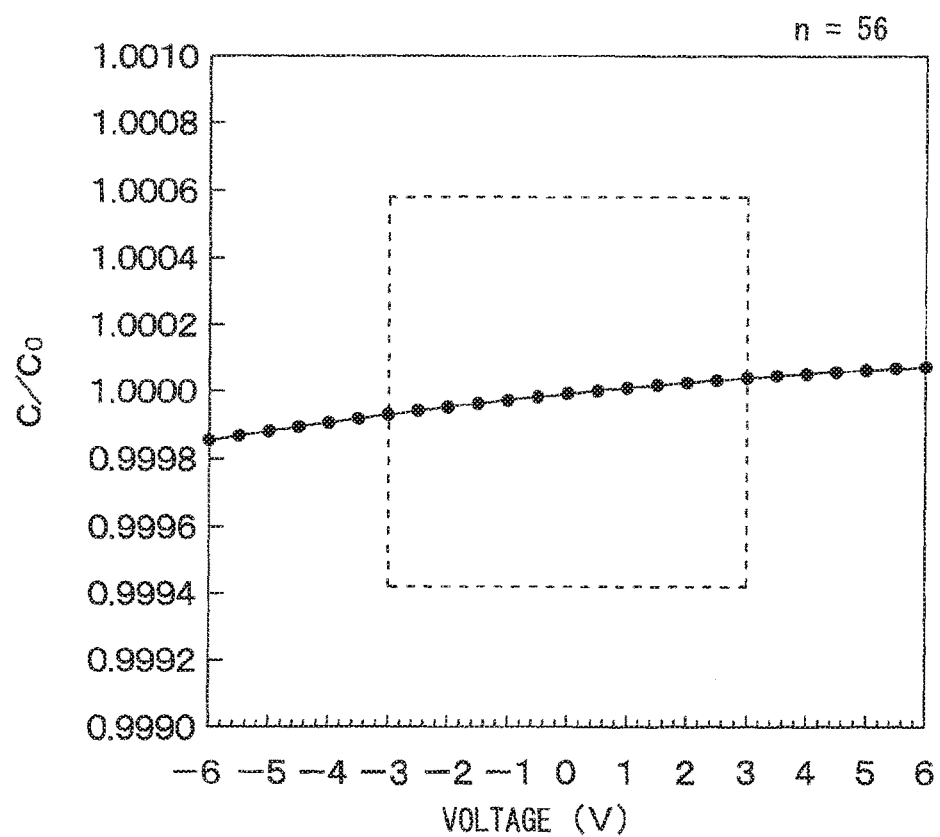
FIG. 11 is a drawing that illustrates the electrical properties of the MIM capacitor according to the first embodiment.

In a case where the damage on the capacitive film 4 can be suppressed at a time of forming the first layer 5a, the breakdown voltage reliability of the capacitive film 4 is ensured as comparing with the situation where the damage occurs as illustrated as a solid line in FIG. 5. In addition, the electrical property of the MIM capacitor is examined in a case where the first layer 5a is formed, and the electrical property is illustrated in a linear shape as shown in FIG. 11. If the electrical property is illustrated in a quadratic function approximation, the first coefficient is 21.5 ppm/V and the second coefficient is −1.2 ppm/V$^2$ in the approximate quadratic function. It is determined that the approximate quadratic function is illustrated closely in a straight line based on the result.

Accordingly, the damage on the capacitive film 4 has an influence on the electrical property of the MIM capacitor. The damage on the capacitive film 4 is mainly caused by roughness of the lower electrode 3 and physical damage at a time of forming the upper electrode 5.

Figure 12:
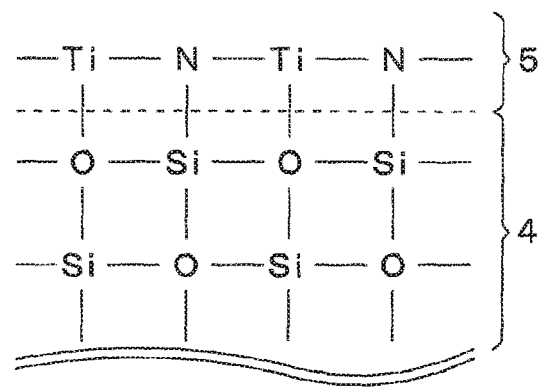
FIG. 12 is a drawing that illustrates an atomic state of the capacitive film and the upper electrode of the MIM capacitor according to the first embodiment.

As mentioned above, if the lower electrode 3 is made to be flat by eliminating roughness, the damage on the capacitive film 4 caused by roughness of the lower electrode 3 can be minimized, and the physical damage on the capacitive film 4 can be minimized by forming the first layer 5a of the upper electrode 5 through, for example, the CVD. For example, as illustrated in FIG. 12, the crystal structure inside the capacitive film 4 is in order, and the number of dangling bonds is reduced. Accordingly, it is possible to manufacture a semiconductor device having a capacitor in which the damage on the capacitive film 4 is suppressed for improving the reliability of the capacitive film 4. In addition, it is possible to suppress an increase in resistance of the upper electrode 5 by forming the second layer 5b on the first layer 5a through, for example, the PVD without forming the whole upper electrode 5 through, for example, the CVD.

Thus, it is possible to manufacture a semiconductor device in which the damage on the capacitive film 4 can be suppressed for improving the reliability of the capacitive film 4.

(Second Embodiment)

The following describes a second embodiment. The present embodiment describes the respective structures of the capacitive film 4 and the upper electrode 5, which are modified from the ones described in the first embodiment. Other than that, the second embodiment is similar to the first embodiment. The following only describes the parts different from the ones described in the first embodiment.

Figure 13:
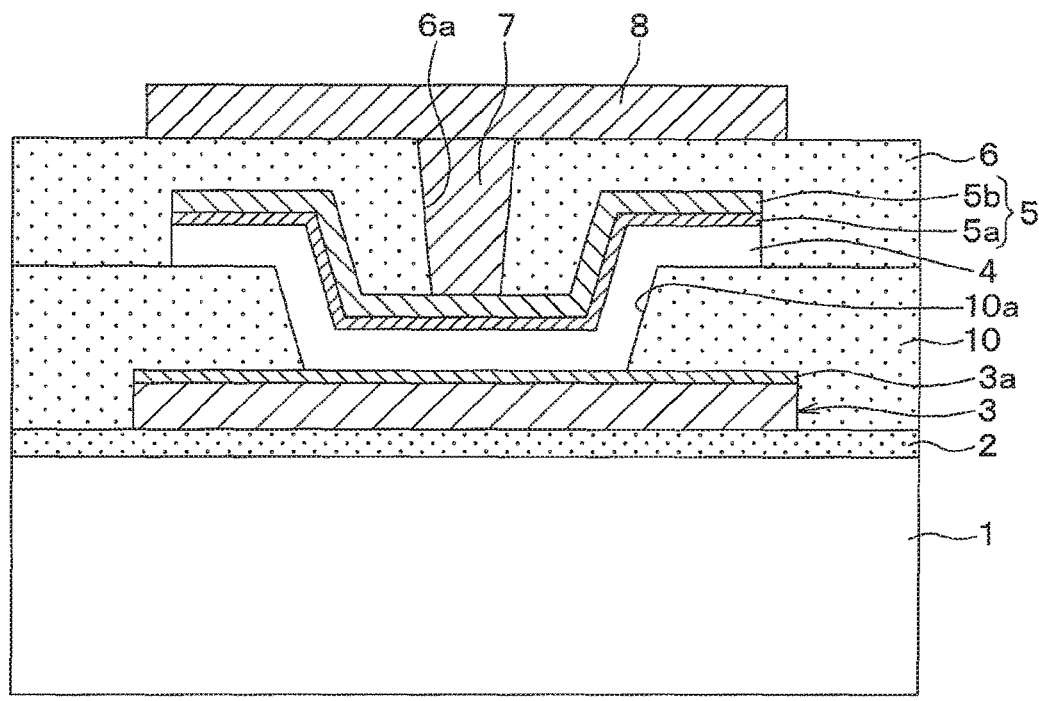
FIG. 13 is a cross sectional view of a semiconductor device according to a second embodiment.

As illustrated in FIG. 13, an interlayer insulation film 10 is formed on the lower electrode 3, and the capacitive film 4 and the upper electrode 5 are formed so as to enter a trench 10a, which is formed to penetrate the interlayer insulation film 10. The lower electrode 3 is exposed from the trench 10a, and the capacitive film 4 and the upper electrode 5 are stacked in order so as to be connected to the part of the lower electrode 3 which is in exposure. The interlayer insulation film 6 and the wiring 8 are formed in order on the upper electrode 5, and the wiring 8 is electrically connected to the upper electrode 5 through the via hole 7, which is formed inside the contact hole 6a of the interlayer insulation film 6.

The present embodiment describes the MIM capacitor with a trench structure in which the capacitive film 4 and the upper electrode 5 enter the trench 10a. Even when the MIM capacitor is configured with the above-mentioned trench structure, this embodiment generates an advantage effect similar to the first embodiment by forming the metal oxide film 3a at one surface side of the lower electrode 3 and forming the first layer 5a at the upper electrode 5.

The method for manufacturing the semiconductor device having the above-mentioned trench structure is essentially similar to the method described in the first embodiment. However, the step for manufacturing, for example, the capacitive film 4 and the upper electrode 5 is modified from the manufacturing method described in the first embodiment. In particular, prior to the step illustrated in FIG. 2C, after the interlayer insulation film 10 is formed by, for example, TEOS film, the trench 10a is formed against the interlayer insulation film 10 by using a mask (not shown). Subsequently, the steps subsequent to the step illustrated in FIG. 2C are carried out in order. With this manufacturing method, the semiconductor device with the MIM capacitor related to this embodiment can be manufactured.

(Third Embodiment)

The following describes a third embodiment. The present embodiment is configured by using the MIM capacitor described in the first and second embodiments for configuring a capacitor in reverse connection. The configuration of the MIM capacitor in this embodiment is similar to the one described in each of the first and second embodiments. Only the parts different from the first and second embodiments are described in the following.

Figure 14:
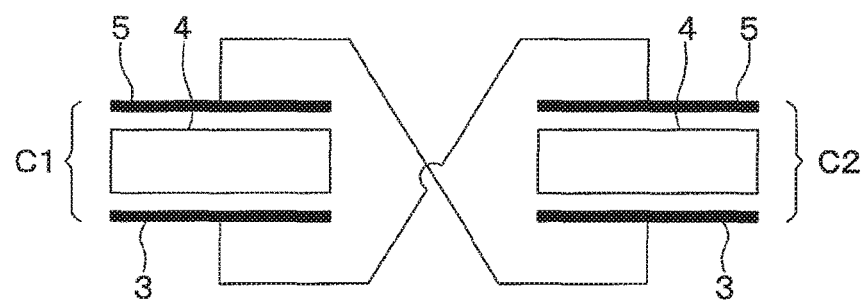
FIG. 14 is a circuit diagram that shows a connection configuration of an MIM capacitor according to a third embodiment.

As illustrated in FIG. 14, the present embodiment includes two MIM capacitors, which are described in the first and second embodiments. The upper electrode 5 in an MIM capacitor C1 is electrically connected to the lower electrode 3 in another MIM capacitor C2, and the lower electrode 3 in the MIM capacitor C1 is electrically connected to the upper electrode 5 in the MIM capacitor C2.

Figure 15:
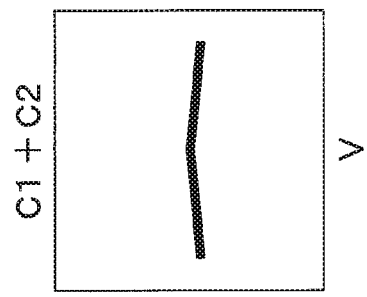
FIG. 15 is a schematic diagram that illustrates the electrical properties of the MIM capacitor with the connection configuration illustrated in FIG. 14.
Figure 15:
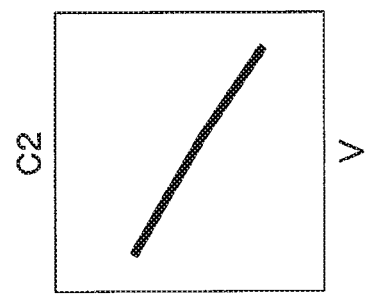
Figure 15:
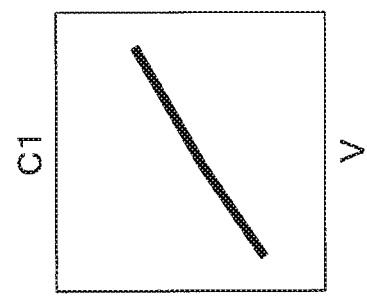

When two MIM capacitors C1 and C2 are configured to be in reverse connection, the respective electrical properties are summed up. In other words, as illustrated in FIG. 15, with regard to the electrical property in the MIM capacitor C1, the change in capacitance (C/Co) increases based on an increase in the voltage (V); and, with regard to the electrical property in the MIM capacitor C2, the change in capacitance (C/Co) decreases based on an increase in the voltage (V). Accordingly, as the electrical properties of both the MIM capacitors C1 and C2 are summed up, the skewed condition in the electrical properties is cancelled so that the electrical property is made to be in flat condition. Therefore, it is possible to cancel the linear component, that is, the first coefficient in the electrical property so that the electrical property can be closely made in constant.

(Other Embodiments)

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

For example, the improvement in film quality of the capacitive film 4 is made in both of the formation of the metal oxide film 3a at one surface side of the lower electrode 3 and the formation of the first layer 5a at the upper electrode 5; however, the improvement can be made in at least one of the formation processes.

However, when the improvement is made in both formation processes, the advantageous effect in improving the film quality of the capacitive film 4 can be enhanced so that the reliability of the capacitive film 4 is further enhanced.

Although the upper electrode 5 is configured by forming the second layer 5b on the first layer 5a, the second layer 5b is not necessarily to be formed. The via hole 7 may be directly connected to the first layer 5a.

The insulation films such as silicon oxidation film and silicon nitride film as the configuration material for the capacitive film 4 are exemplified. However, other types of insulation film such as aluminum oxide ($AL_2O_3$) may be used as the configuration material for the capacitive film 4. Moreover, a stacked layer structure having multiple types of insulation films may also be used.

The disclosure describes, for example, the CVD and ALD for forming the first layer 5a at the upper electrode 5. However, the first layer 5a may also be formed by metal organic chemical vapor deposition (MOCVD).

The above embodiment describes the first electrode is configured as the lower electrode and the second electrode is configured as the upper electrode. This configuration is one of several examples. The present disclosure may also be applied to a structure having a first electrode and a second electrode for configuring a capacitor having a Metal Insulation Metal structure.

The invention claimed is:

1. A method for manufacturing a semiconductor device having a capacitor with a Metal-Insulator-Metal structure, the method comprising:
   forming a first electrode;
   forming a capacitive film on the first electrode, the capacitive film in contact with the first electrode; and
   forming a second electrode on the capacitive film, the second electrode in contact with the capacitive film,
   wherein, in the forming of the second electrode, a first layer is formed on a surface of the capacitive film through chemical vapor deposition, atomic layer deposition, or metal organic chemical vapor deposition,
   wherein, in the forming of the second electrode, a second layer is formed on the first layer through physical vapor deposition,
   wherein, in the forming of the first electrode, a metal oxide film is formed at one surface of the first electrode facing the capacitive film,
   wherein two capacitors each with the Metal-Insulator-Metal structure and each configured by the first electrode, the capacitive film and the second electrode are provided,
   wherein the two capacitors are connected in a reverse connection by:
      electrically connecting the second electrode of one of the two capacitors to the first electrode of the other one of the two capacitors, and
      electrically connecting the first electrode of the one of the two capacitors to the second electrode of the other one of the two capacitors,
   wherein the method for manufacturing the semiconductor device further comprises:
      forming an interlayer insulation film on the first electrode and forming a trench penetrating the interlayer insulation film, and
      forming the capacitive film and the second electrode after forming the trench, and
   wherein, in the forming of the capacitive film, the capacitive film is formed to be in contact with the first electrode, which is exposed from the trench.

2. The method for manufacturing the semiconductor device according to claim 1,
   wherein a single layer film, which is configured by one of aluminum, titanium nitride, tungsten and copper, or a laminated film, which is configured by a plurality of materials, is formed as the first layer in the forming of the first layer.

3. The method for manufacturing the semiconductor device according to claim 1,
   wherein a film, which is configured by aluminum, titanium nitride, tungsten or copper, is formed as the second layer in the forming of the second layer.

4. The method for manufacturing the semiconductor device according to claim 1,
   wherein, in the forming of the metal oxide film, the metal oxide film is formed at the one surface of the first electrode through $O_2$ plasma oxidation as the chemical vapor deposition mainly based on $O_2$ radical or through thermal oxidation.

* * * * *